United States Patent [19]
Lee

[11] Patent Number: 5,157,279
[45] Date of Patent: Oct. 20, 1992

[54] DATA OUTPUT DRIVER WITH SUBSTRATE BIASING PRODUCING HIGH OUTPUT GAIN

[75] Inventor: Seung-Keun Lee, Seoul, Rep. of Korea

[73] Assignee: Samsung Electronics Co., Ltd., Suwon, Rep. of Korea

[21] Appl. No.: 724,889

[22] Filed: Jul. 2, 1991

[30] Foreign Application Priority Data

May 28, 1991 [KR] Rep. of Korea ............... 1991-8756

[51] Int. Cl.⁵ .................. H03K 3/01; H03K 17/16
[52] U.S. Cl. .................. 307/296.2; 307/443; 307/451
[58] Field of Search .............. 307/443, 296.2, 451

[56] References Cited
U.S. PATENT DOCUMENTS 4,529,897  7/1985  Suzuki et al. ............... 307/296.2
4,833,343  5/1989  Fuchs ......................... 307/296.2

Primary Examiner—David Hudspeth
Assistant Examiner—Andrew Sanders
Attorney, Agent, or Firm—Robert E. Bushnell

[57] ABSTRACT

The data output driver circuit producing high output gain, by controlling the voltage decline caused by body effect produced by a difference between bulk voltage and source voltage in the NMOS transistors connected in series, is disclosed. To obtain such a circuit, the data output driver circuit is provided with a constant voltage means 100 receiving the data from data output buffer and supplying a given voltage to the bulk of first output NMOS transistor 1. Consequently, through the constant voltage circuit 100, the voltage $V_{cc}-V_{th}$ equal to the voltage of source of the pull-up transistor 5 is applied to the bulk of the pull-up transistor 5, and in other case, the voltage equal to the voltage between the bulk and the source of the first output transistor 1 is always kept by applying the ground voltage to the bulk of the pull-up transistor. Thus the inventive data output driver has high output gain without the influence caused by body effect. Also the data output driver circuit is applicable to all semiconductor elements and particularly to those semiconductor elements requiring high output gain with potential-low power source voltage.

11 Claims, 2 Drawing Sheets

DATA OUTPUT DRIVER WITH SUBSTRATE BIASING PRODUCING HIGH OUTPUT GAIN

FIELD OF THE INVENTION

The present invention relates to a data output driver of a semiconductor memory device and, more particularly, to the data output driver producing a high output gain.

TECHNICAL BACKGROUND

A known data output driver serves to transfer a signal from the inside of a semiconductor element to the outside thereof. Compared with a P-type metal oxide semiconductor(PMOS) field effect transistor, an N-type metal oxide semiconductor (NMOS) field effect transistor needs a smaller layout area, and the mobility of its active carrier, that is, electron, is greater than that of the active carrier, that is, hole of the PMOS transistor. Therefore, data output drivers mostly utilizes NMOS transistors.

FIG. 1 illustrates a conventional data output driver. The data output driver has two NMOS transistors. A first NMOS transistor for pull-up has a gate receiving the data of data output buffer(not illustrated), and a drain connected to a power source voltage terminal. A second NMOS transistor 2 for pull-down has a gate receiving a reversed data of the data output buffer, and a source connected to a ground voltage terminal. A source of the first NMOS transistor 1 for output and a drain of second NMOS transistor 2 for output are commonly connected to an output node 3. The ground voltage terminal is connected to bulks of the first NMOS transistor 1 and the second NMOS transistor 2.

The operation of FIG. 1 will now be described. When the data having an ground voltage level $V_{ss}$ corresponding to low state is applied to the gate of the first transistor 1, the first NMOS transistor 1 turns off and the second NMOS transistor 2 turns on. Thereby the output of data output driver becomes logic "low" state. However, when the data having a power source level $V_{cc}$ corresponding to high state is applied to the gate of the first transistor 1, the NMOS transistor 1 turns on and the NMOS transistor 2 turns off. Thus the output of the data output driver becomes logic "high" state. Here, it is a well known fact in this field that the logic "low" state is usually lower than TTL (transistor-transistor logic)level, i.e., 0.8V and the logic "high" state is usually higher than TTL level, i.e., 2.4V. When logic "high" level is produced, the voltage of $V_{CC}-V_{TH}$ is accumulated in the output node 3. Actually, however, a voltage difference between the voltage applied to the source of the first NMOS transistor 1 and the ground voltage applied to a bulk of the first NMOS transistor 1, makes voltage lower than the $V_{CC}-V_{TH}$ level be accumulated in the output node 4. The reason is that a body effect causing the voltage difference between bulk and source produced when $V_{SS}$ is applied to the bulk of the first NMOS transistor and the first NMOS transistor turns on, raises the threshold voltage $V_{TH}$ to higher voltage itself.

In FIG. 2, a threshold voltage increased by body effect is illustrated. It shows that threshold voltage is increased by the voltage $V_{BS}(V_{SUBSTRATE}-V_{SOURCE})$ due to the body effect.

The voltage $V_{BS}$ will be described briefly. When the voltage is applied to the source of NMOS transistor, a depletion layer adjacent to the source expands in proportional to the voltage applied to the source. Thus, only if the voltage corresponding to the expanded deletion layer, in addition to the threshold voltage itself, is applied to the gate of the NMOS transistor, a reverse layer between the drain and the source is formed, to turn on the NMOS transistor. In other words, a difference between the threshold voltage $V_{TH}$ formed before the expansion of the depletion layer of the source and the voltage $V_{TH}$ formed at the expansion of the depletion layer of the source, is $V_{BS}$, and it is expressed in $\alpha$.

Accordingly, voltage of $V_{CC}-(V_{TH}+\alpha)$ is accumulated in the output node 3 of FIG. 1. This causes a decline in output gain($V_{OH}$). Particularly if the potential of power source voltage terminal is in logic "low" state, the output gain is lowered to considerably. Therefore, the conventional data output driver cannot sufficiently carry out the function of a data output driver requiring the high output gain.

SUMMARY OF THE INVENTION

It is, therefore, an object of the present invention to provide a data output driver circuit producing high output gain, by controlling an undesirable increase of the threshold voltage caused by body effect.

In order to attain the object, the data output driver, provided with a first and a second output transistors receiving at each gate a pair of signals having logic levels complementary to each other, has a constant voltage means for supplying a first signal to a bulk of the first output transistor when the pair signals are in a first logic state, and supplying a second signal to the bulk of the first output transistor when the pair signals are in a second logic state.

BRIEF DESCRIPTION OF THE DRAWINGS

The above object and advantages of the present invention will be apparent by describing the preferred embodiment of the present invention in detail with reference to the attached drawings, in which.

DETAILED DESCRIPTION OF THE PREFERRED EMBODIMENT

Figure 3:
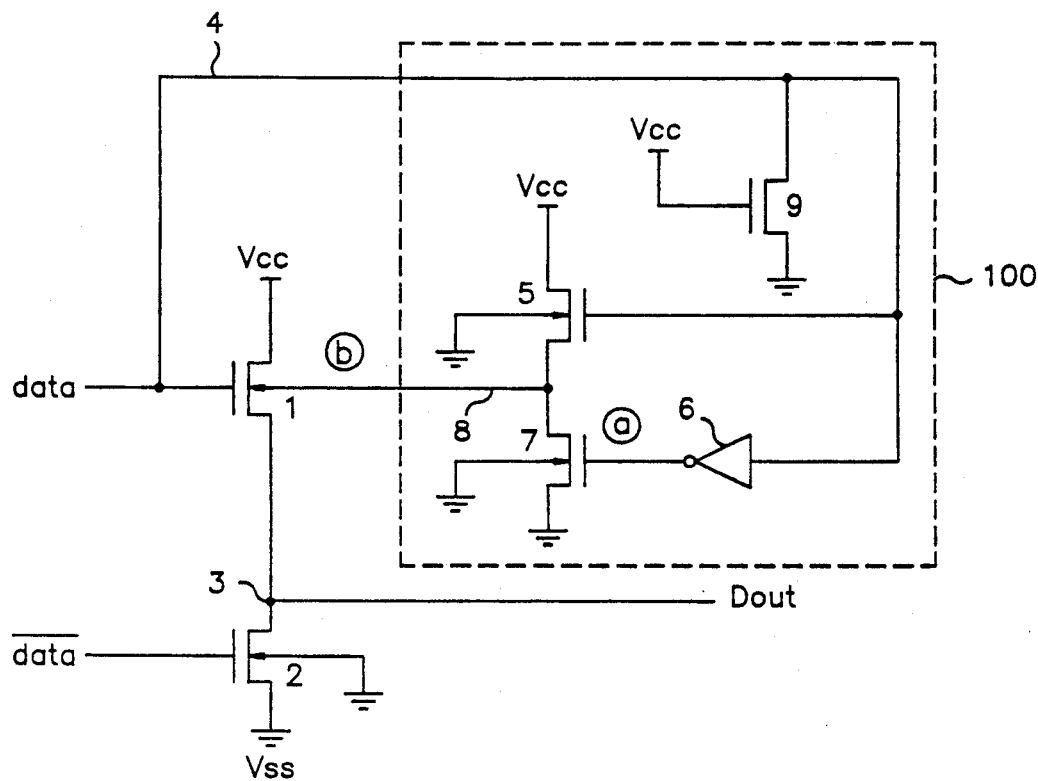
FIG. 3 is an embodiment of data output driver according to the present invention.

FIG. 3 is a circuit diagram showing an embodiment of data output driver according to the present invention. In the data output driver provided with a first output transistor 1 and a second output transistor 2 receiving at each gate a pair of signals having logic levels complementary to each other, the data output driver is provided with an input line 4 connected to the gate of the first output transistor 1, a pull-up transistor 5 having a gate connected to the input line 4 and having a channel connected in between the power source voltage terminal and a bulk of the first output transistor 1, and a pull-down transistor 7 having a gate connected to the input line 4 and having a channel connected in between the bulk and the ground voltage. Also the inventive data output driver includes a bias device, connected in between the input line 4 and ground voltage, for supplying a given bias voltage to the input line 4 when the potential of the input line 4 is lower than the given voltage level.

In the present invention, the pull-up and pull-down transistor 5, 7 are made up of NMOS transistors, respectively as an optimal embodiment. The pull-down transistor 7 is made to receive the potential of the input line 4 through inverter 6. The bias device also includes an NMOS transistor. As illustrated, the dotted block is the constant voltage means 100, and the line connected from the channel of the pull-up and pull-down transistors 5, 7 to the bulk of the first output transistor 1, is an output line 8. The signal from the inverter 6 is set as a and the signal loaded on the output line 8 is set as b.

The operation of the FIG. 3 will now be described. First of all, when the data is in logic "low" state, that is, a ground voltage level, the first NMOS transistor 1 turns off and the second NMOS transistor 2 turns on. The output node 3 drops to a logic "low" state. Referring to the constant voltage means 100, the pull-up transistor 5 turns off, and the pull-down transistor 7 turns on by receiving a logic high state signal a through the inverter 6, because the potential of the input line 4 is the logic "low" state. Furthermore the output line 8 becomes the logic "low" state, therefore the signal b in the logic "low" state is applied to the bulk of the first NMOS transistor 1. Secondly when the data is in logic "high" state, that is, power source level, the first NMOS transistor 1 turns on and the second NMOS transistor 2 turns off. Thus the high state potential is accumulated in the output node 3. Since the potential of input line 4 of the constant voltage means 100 is the logic "high" state, the pull-up transistor 5 turns on and the pull-down transistor 7 turns off by receiving the logic "low" state signal a inverted through the inverter 6. Consequently, the voltage by subtracting threshold voltage from power source voltage through the pull-up transistor 5, that is, $V_{CC}-V_{TH}$ voltage level, is loaded on the output line 8, and the $V_{CC}-V_{TH}$ voltage level of the output line 8 is applied to the bulk of the first NMOS transistor 1 as b signal. The voltage level of b signal is equal to the potential $V_{CC}-V_{TH}$ of source of the first NMOS transistor 1. Thereby the circuit of the FIG. 3 produces no body effect. As a result, potential $V_{CC}-V_{TH}$ is accumulated in the output node 3 without decreasing of the potential. The bias device including the NMOS transistor 9, is to keep the potential of the input line 4 in the logic "low" state, when the potential of the input line 4 is in the logic "high" state, that is, the power source voltage level, or the ground voltage level does not reach the logic "low" state. In other words, if the potential of the input line 4 does not reach the logic "high" state, the signal b is kept in the logic "low" state, to be applied to the bulk of the first NMOS transistor 1.

In conclusion, the voltage equal to the voltage of the source of the first NMOS transistor 1 is always applied to the bulk of the first NMOS transistor 1. Therefore the rise of threshold voltage caused by the body effect is thereby controlled.

Figure 4:
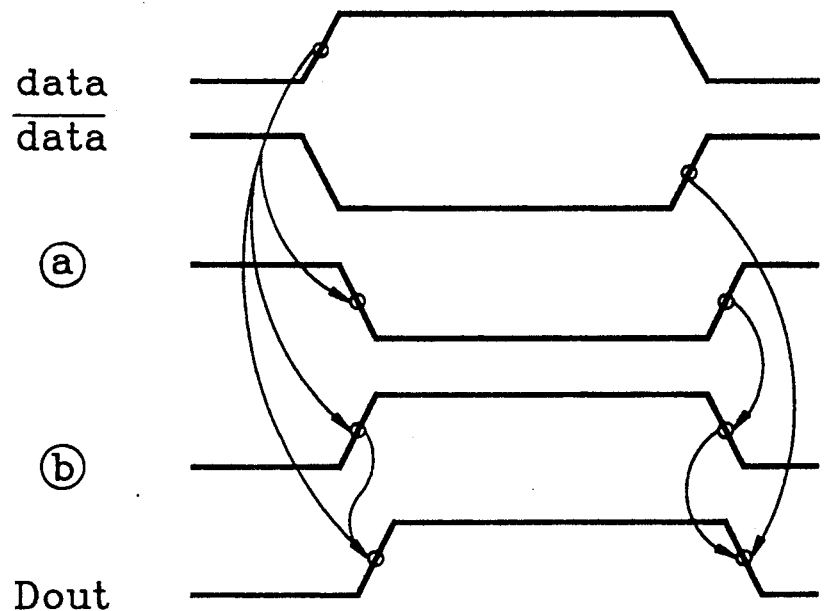
FIG. 4 is a timing diagram of data output driver according to the present invention.

FIG. 4 is an operation timing diagram of the circuit shown in FIG. 3. As seen in the FIG. 4, the b signal, that is the voltage applied to the bulk of the first NMOS transistor 1, rises the logic "high" state at the same time that data rises the logic "high" state. It can be also easily understood that the a signal keeps the b signal low when the data is the logic "low" state. Consequently, $D_{OUT}$ with high output gain is thereby obtained.

Figure 1:
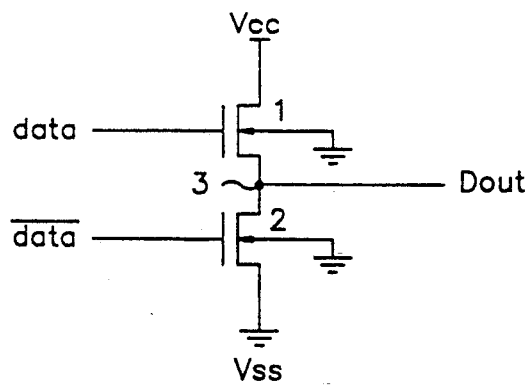
FIG. 1 is a circuit diagram of the conventional data output driver.
Figure 2:
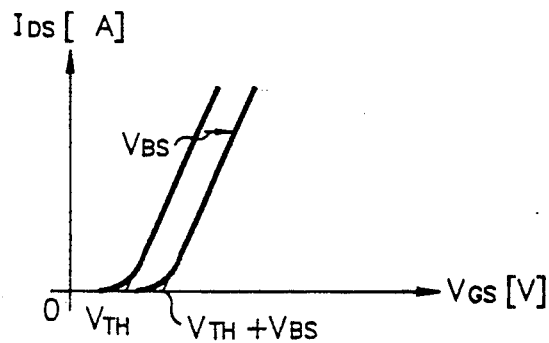
FIG. 2 is a graph of threshold voltage varied by the body effect.
Figure 5:
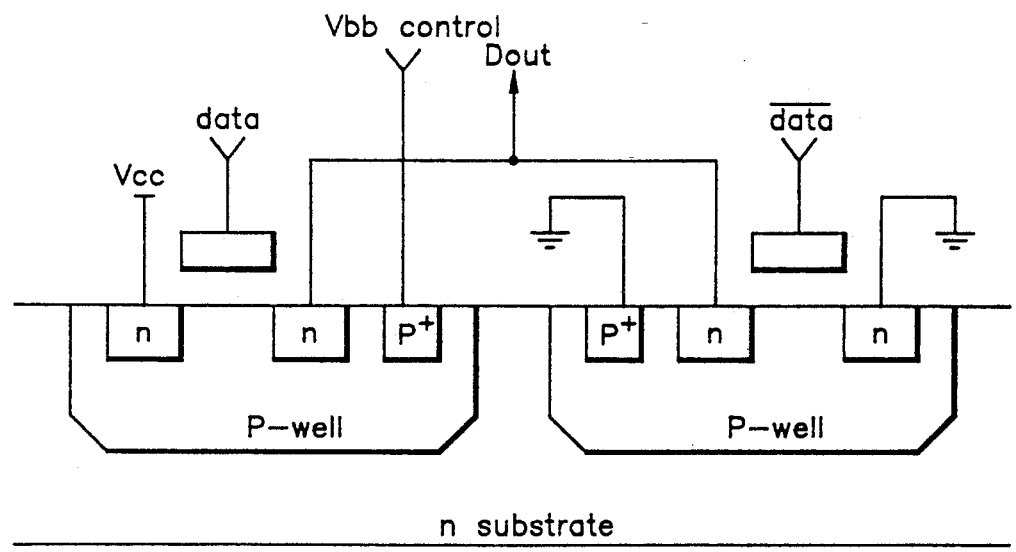
FIG. 5 is a cross sectional view of data output driver according to the present invention.

FIG. 5 is a cross sectional view illustrated to help understand the data output driver according to the present invention. The constant voltage circuit 100 of the FIG. 3 is not shown. Only the portion that controls bulk voltage is shown therein. A P+ layer is formed in the manner of diffusion by implanting impurities into the bulk of the first NMOS transistor 1, and the bulk voltage of the first NMOS transistor is controlled through the P+ layer.

The circuit illustrated in FIG. 3 is one embodiment realizing the present invention into reality. Accordingly it can be easily understood by those who have a usual knowledge in this field that each constituent element of the constant voltage means is replaceable with the other element unless it deviates from the technical category of the present invention.

The circuit according to the present invention based on the detailed description of the invention is applicable to almost all of the semiconductor elements in which drivers are used. Particularly, in applying a low level power source voltage, it can solve the drawback of data output driver with low output gain.

While the invention has been particularly shown and described with reference to the preferred embodiment thereof, it will be easily understood those who skilled in the art that the foregoing and change in form and detail may be made without departing from the spirit and scope of the present invention.

What is claim is:

1. A data output driver circuit, comprising:
   a first output transistor and a second output transistor having a first gate and a second gate, respectively, and receiving an input data signal at said first gate and a complementary data signal at said second gate, said input data signal and said complementary data signal being complementary to each other; and
   constant voltage means for supplying a first signal at a first logic level to a bulk of said first output transistor when said input data signal is in a first state, and for supplying said first signal at a second logic level to said bulk of said first output transistor when said input data signal is in a second state;
   wherein said constant voltage means comprises:
   an input line connected to a gate of said first output transistor;
   a pull-up transistor having a gate connected to said input line and having a channel connected in between a first potential terminal and said bulk of said first output resistor; and
   a pull-down transistor having a gate connected to said input line and having a channel connected in between said bulk of said first output transistor and a second potential terminal.

2. The data output driver circuit, as claimed in claim 1, further comprising bias means connected in between said input line and a second potential terminal, for supplying a bias voltage to said input line when a potential of said input line is lower than a predetermined level.

3. A data output driver circuit, comprising:
   a first output transistor and a second output transistor having a first gate connected to a first input line and a second gate connected to a second input line, respectively, to receive an input data signal at said first gate and a complementary data signal at said second gate, wherein said input data signal and said complementary data signal are complementary;

a pull-up transistor having a gate connected to said first input line and having a channel connected in between a source potential terminal and a bulk of said first output transistor;

a pull-down transistor having a gate connected to one of said first input line and said second input line and having a channel connected in between said bulk of said first output transistor and a ground potential terminal; and bias means connected in between said first input line and a ground potential terminal, for supplying a bias voltage to said first input line when a potential of said first input line is lower than a given level.

4. The data output driver as claimed in claim 3, wherein said bias means discharges the potential of said first input line to said ground potential when the potential of said first input line is lower than approximately 2.4V.

5. The data output driver circuit, according to claim 1, wherein a channel of said first output transistor is connected between said first potential and a data output node, and a channel of said second output transistor is connected between said data output node and said second potential.

6. The data output driver circuit, according to claim 5, wherein a bulk of said second output transistor is connected to said second potential.

7. The data output driver circuit, according to claim 1, further comprising an inverter means for inverting said data signal received by said pull-down transistor.

8. The data output driver circuit, according to claim 1, further comprising a second potential terminal connected to a bulk of said pull-down transistor and a bulk of said pull-up transistor.

9. The data output driver circuit as claimed in claim 2, wherein said bias means comprises a first potential terminal, a second potential terminal, and a bias stage transistor having a gate connected to said first potential terminal and a channel of said bias stage transistor connected between said input line and said second potential.

10. A data output driver circuit, comprising:

a first output transistor and a second output transistor having a first gate and a second gate, respectively, and means for receiving a digital data signal at said first gate and a complementary data signal at said second gate, said digital data signal and said complementary data signal being complementary to each other; and constant voltage means for supplying an output signal exhibiting a logic low state to a bulk of said first output transistor when said digital data signal is in a logic low state, and for supplying said output signal exhibiting state a logic high state to said bulk of said first output transistor when said digital data signal is in a logic high state.

11. The data output driver circuit, as claimed in claim 1, wherein the second potential is a ground potential.

* * * * *

UNITED STATES PATENT AND TRADEMARK OFFICE
CERTIFICATE OF CORRECTION

PATENT NO.  : 5,157,279
DATED       : Oct. 20, 1992
INVENTOR(S) : Seung-Keun LEE It is certified that error appears in the above-indentified patent and that said Letters Patent is hereby corrected as shown below:

Column 3,

Line 6,    after "transistors", delete comma " , ",

Column 4,

Line 10,    after "transistor", insert -- 1 --:

Signed and Sealed this

Eighteenth Day of June, 1996

Attest:

BRUCE LEHMAN

*Attesting Officer*    *Commissioner of Patents and Trademarks*